(12) United States Patent
Walker et al.

(10) Patent No.: US 12,405,313 B1
(45) Date of Patent: Sep. 2, 2025

(54) BATTERY LIFE ESTIMATION

(71) Applicant: Samsara Inc., San Francisco, CA (US)

(72) Inventors: Benedict Walker, San Francisco, CA (US); Ernie Aguilar, Austin, TX (US); Wael Barakat, San Francisco, CA (US)

(73) Assignee: Samsara Inc., San Francisco, CA (US)

( * ) Notice: Subject to any disclaimer, the term of this patent is extended or adjusted under 35 U.S.C. 154(b) by 369 days.

(21) Appl. No.: 17/819,926

(22) Filed: Aug. 15, 2022

(51) Int. Cl.
| | | |
|---|---|---|
| G01R 31/392 | (2019.01) | |
| G01R 19/165 | (2006.01) | |
| G01R 31/36 | (2020.01) | |
| G01R 31/374 | (2019.01) | |
| G01R 31/382 | (2019.01) | |
| G01R 31/385 | (2019.01) | |
| G01R 31/387 | (2019.01) | |

(52) U.S. Cl.
CPC ....... *G01R 31/392* (2019.01); *G01R 31/3648* (2013.01); *G01R 31/374* (2019.01); *G01R 31/387* (2019.01); *G01R 19/16542* (2013.01); *G01R 31/36* (2013.01); *G01R 31/382* (2019.01); *G01R 31/385* (2019.01)

(58) Field of Classification Search
CPC .............. G01R 31/392; G01R 31/3648; G01R 31/374; G01R 31/387; G01R 31/382; G01R 31/385; G01R 19/16542; G01R 31/36
See application file for complete search history.

(56) References Cited

U.S. PATENT DOCUMENTS

| | | | | |
|---|---|---|---|---|
| 2004/0017180 | A1* | 1/2004 | Cook | G01R 31/3648 320/132 |
| 2011/0307033 | A1* | 12/2011 | Michaels | A61N 1/3708 607/60 |
| 2012/0215517 | A1* | 8/2012 | Bohlen | G01R 31/3647 703/18 |
| 2021/0216126 | A1* | 7/2021 | Dearman | G06F 1/26 |

OTHER PUBLICATIONS

Mathscinotes (Spline Interpolation Example Using Battery Capacity, Math Encounters Blog, mathcscinotes.com, Mar. 10, 2013) (Year: 2013).*

(Continued)

*Primary Examiner* — Lisa M Caputo
*Assistant Examiner* — Christian T Bryant
(74) *Attorney, Agent, or Firm* — Nicholson, De Vos, Webster & Elliott, LLP

(57) ABSTRACT

A method for estimating a remaining battery life of a non-rechargeable battery of an Internet of Things (IoT) device. The method includes determining an amount of battery capacity used by the IoT device while the IoT device was operating in an active mode, an amount of battery capacity used by the IoT device while the IoT device was operating in a sleep mode, and an amount of self-discharge of the non-rechargeable battery while the IoT was deployed based on temperatures of environments in which the IoT device was located. The method further includes determining an estimated remaining battery life of the non-rechargeable battery based on an initial capacity of the non-rechargeable battery, the amounts of battery capacity used by the IoT (Continued)

device while the IoT device was operating in the active mode and the sleep mode, and the amount of self-discharge of the non-rechargeable battery while the IT was deployed.

20 Claims, 9 Drawing Sheets

(56) References Cited

OTHER PUBLICATIONS

Ansari ("Why does a lead-acid battery self-discharge?", Payperwatt, May 25, 2022, https://www.payperwatt.com/post/why-does-a-lead-acid-battery-self-discharge) (Year: 2022).*

Utsunomiya et al. (Self-discharge behavior and its temperature dependence of carbon electrodes in lithium-ion batteries, Journal of Power Sources, vol. 196, Issue 20, 2011, pp. 8598-8603, ISSN 0378-7753, https://doi.org/10.1016/j.jpowsour.2011.05.066.) (Year: 2011).*

\* cited by examiner

Fig. 3

Determine an amount of battery capacity used by the IoT device while the IoT device was operating in an active mode based on a temperature of an environment in which the IoT was located while the IoT device was operating in the active mode
202

Determine an amount of battery capacity used by the IoT device to perform a location ping
304

Determine an amount of battery capacity used by the IoT device to perform a GPS data download based on a temperature of an environment in which the IoT was located while the IoT device performed the GPS data download
306

Determine a temperature of an environment in which the IoT device was located while the IoT device performed a GPS scan
308

Determine a current draw of the IoT device while the IoT device performed the GPS scan based on the temperature of the environment in which the IoT device was located while the IoT device performed the GPS scan
310

Determine a length of time that the IoT device performed the GPS scan
312

Determine an amount of battery capacity used by the IoT device to perform the GPS scan based on the current draw of the IoT device while the IoT device performed the GPS scan and the length of time that the IoT device performed the GPS scan
314

Determine an amount of battery capacity used by the IoT device to perform a GPS data upload based on a temperature of an environment in which the IoT was located while the IoT device performed the GPS data upload
316

Fig. 4

Determine an amount of battery capacity used by the IoT device while the IoT device was operating in a sleep mode based on a temperature of an environment in which the IoT was located while the IoT device was operating in the sleep mode 204

For each of one or more periods of time (e.g., 5 minute time periods) that occurred while the IoT device was operating in the sleep mode:

Determine a temperature of an environment in which the IoT device was located during the period of time
404

Determine a current draw of the IoT device during the period of time based on the temperature of the environment in which the IoT device was located during the period of time
406

Determine an amount of battery capacity used by the IoT device during the period of time based on the current draw of the IoT device during the period of time and a length of the period of time
408

Accumulate the amount of battery capacity used by the IoT device during each of the one or more periods of time
410

Fig. 5

Determine an amount of self-discharge of the non-rechargeable battery while the IoT was deployed based on a temperature of an environment in which the IoT device was located while the IoT was deployed 206

For each of one or more periods of time (e.g., 5 minute time periods) that occurred while the IoT device was deployed:

Determine a temperature of an environment in which the IoT device was located during the period of time
504

Determine measured data provided by an energizer
506

Determine an amount of self-discharge of the non-rechargeable battery during the period of time based on the temperature of the environment in which the IoT device was located during the period of time, a length of the period of time, and the measured data provided by an energizer
508

Accumulate the amount of self-discharge of the non-rechargeable battery during each of the one or more periods of time
510

Fig. 6

Determine an estimated remaining battery life of the non-rechargeable battery 208

Determine a total amount of battery capacity used by the IoT device based on the amount of battery capacity used by the IoT device while the IoT device was operating in the active mode, the amount of battery capacity used by the IoT device while the IoT device was operating in the sleep mode, and the amount of self-discharge of the non-rechargeable battery
604

Determine a remaining capacity of the non-rechargeable battery based on the initial capacity of the non-rechargeable battery and the total amount of battery capacity used by the IoT device
606

Determine a predicted current draw of the IoT device
608

Determine the estimated remaining battery life of the non-rechargeable battery based on the remaining capacity of the non-rechargeable battery and the predicted current draw of the IoT device
610

BATTERY LIFE ESTIMATION

FIELD

Embodiments of the invention relate to the field of battery life estimation, and more specifically, to estimating a remaining battery life of a non-rechargeable battery of an Internet of Things (IoT) device.

BACKGROUND

Batteries are used to store energy for use when needed by converting chemical energy into electrical energy. Non-rechargeable batteries (e.g., lithium thionyl chloride batteries), also known as primary battery or primary cells, are designed to be used once and discarded. In general, the electrochemical reaction occurring in the non-rechargeable battery is not reversible, rendering the cell unrechargeable. As the non-rechargeable battery is used, the chemicals in the battery are used up to generate power; when the chemicals are gone, the battery stops producing electricity. The use of non-rechargeable batteries may be advantageous (compared to the use of secondary/rechargeable batteries) for some applications. Non-rechargeable batteries have higher capacity, are easily accessible, generally less expensive, and more tolerant to changes in temperatures (that is, they operate well at low and high temperatures) compared to rechargeable batteries. Non-rechargeable batteries are used in pacemakers, remote controls, electronic keys, water meters, asset trackers, gateway devices.

Non-rechargeable batteries can be deployed in electronic devices such as Internet of Things (IoT) devices. For example, non-rechargeable batteries can be used in asset trackers mounted on assets that are not connected to a power source. Different IoT devices may have different communication abilities, such as the ability to communicate to a back end or not, the ability to act as a gateway for other IoT devices to communicate to a back end or not, and/or the ability to communicate through a gateway to a back end. Some such IoT devices have two to five years of life expectancy due to battery failure depending on a number of factors (e.g., their configuration (e.g., how often the device is set to wake up from a sleep mode, how much power the device consumes when the device wakes up, etc.), environmental factors (e.g., temperature), etc.). It is undesirable to have the battery fail (which results in the IoT device failing) while the IoT device is deployed out in the field.

BRIEF DESCRIPTION OF THE DRAWINGS

The invention may best be understood by referring to the following description and accompanying drawings that are used to illustrate embodiments of the invention. In the drawings:

FIG. 3 is a flow diagram showing operations for determining an amount of battery capacity used by the IoT device while the IoT device was operating in an active mode, according to some embodiments.

FIG. 4 is a flow diagram showing operations for determining an amount of battery capacity used by the IoT device while the IoT device was operating in a sleep mode, according to some embodiments.

FIG. 5 is a flow diagram showing operations for determining an amount of self-discharge of the non-rechargeable battery while the IoT was deployed, according to some embodiments.

FIG. 6 is a flow diagram showing operations for determining an estimated remaining battery life of the non-rechargeable battery, according to some embodiments.

DESCRIPTION OF EMBODIMENTS

Figure 1:
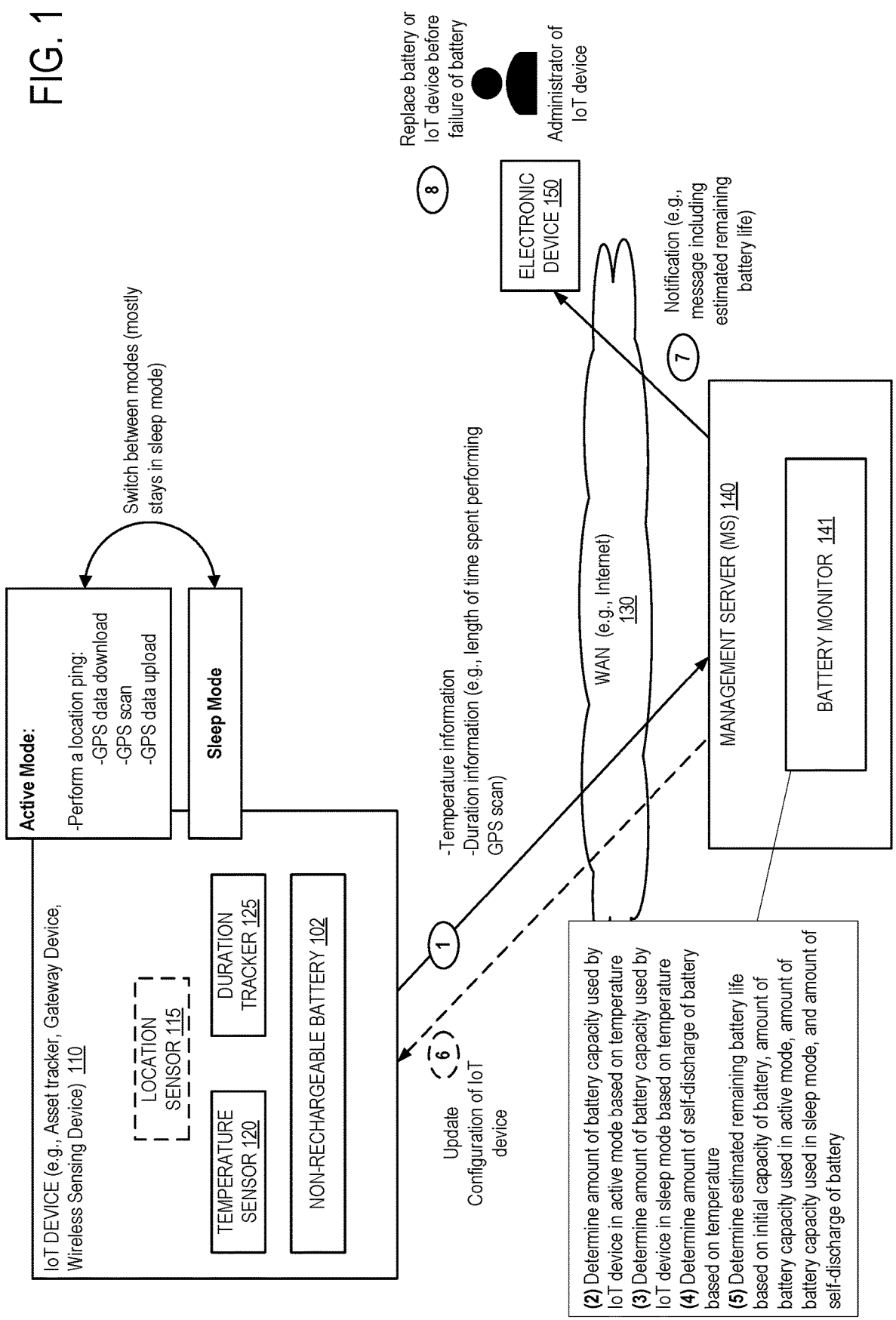
FIG. 1 is a diagram showing a system in which the remaining battery life of a non-rechargeable battery can be estimated, according to some example embodiments.

In the following description, numerous specific details are set forth. However, it is understood that embodiments of the invention may be practiced without these specific details. In other instances, well-known circuits, structures and techniques have not been shown in detail in order not to obscure the understanding of this description. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Bracketed text and blocks with dashed borders (e.g., large dashes, small dashes, dot-dash, and dots) may be used herein to illustrate optional operations that add additional features to embodiments of the invention. However, such notation should not be taken to mean that these are the only options or optional operations, and/or that blocks with solid borders are not optional in certain embodiments of the invention.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

IoT devices are deployed and used to support a variety of applications and use cases. In non-limiting examples, IoT devices can be used in fleet management applications, asset tracking applications, industrial applications (manufacturing analytics, process monitoring, condition monitoring), and remote monitoring of environments (such as in factories, warehouses, etc.), etc. Non-rechargeable batteries are preferred to rechargeable batteries in a variety of applications, as they are generally less expensive, have greater accessibility, have higher capacity, and have high tolerance to changes in temperatures.

Typically, a non-rechargeable battery provides a few years of life expectancy (e.g., few months, 2-5 years, or 10-20 years) to an IoT device before failure. This life expectancy depends on a number of factors such as the configuration of the IoT device (e.g., how often the device is set to wake up from a sleep mode and/or transmit data, how much power is consumed when the device wakes up, etc.) and/or environmental factors (e.g., temperatures). It is undesirable to have the battery fail (and thus the IoT device fail) while the IoT device is deployed in the field. Some IoT devices such as asset trackers may be deployed in remote locations and thus their batteries cannot be easily replaced in a timely manner. As such, it is desirable to be able to accurately estimate the remaining battery life of a battery of an IoT device (e.g., so that an administrator of the IoT device can be notified in advance when the battery is close to failure and take appropriate action (e.g., replace the battery or the IoT device) before the battery fails). Also, it is desirable to be able to estimate the remaining life of a battery while consuming minimal power.

An existing technique to estimate the remaining life of a battery of an IoT device is to is to equip the IoT device with a specific/discrete integrated processing component for measuring the discharge of the battery. The integrated processing component is commonly referred to as a "coulomb counter" or "fuel gauge." However, a drawback of this technique is that the component draws a non-negligible amount of power from the battery to operate (and therefore participates in the discharge of the battery) and further increases the manufacturing cost of the IoT device. Another existing technique to estimate the remaining life of a battery of an IoT device relies on detecting changes in the voltage produced by the battery. However, a drawback of this technique is that it does not work well with certain battery types (e.g., lithium thionyl chloride batteries) that have flat voltage discharge curves.

Embodiments are described herein that can estimate a remaining battery life of an IoT without requiring the IoT device to be equipped with a specific/discrete integrated processing component for estimating remaining battery life (e.g., without equipping the IoT device with a fuel gauge) and without having to rely on detecting changes in the voltage produced by the battery. An example embodiment is a method for estimating a remaining battery life of a non-rechargeable battery of an IoT device. The method includes determining an amount of battery capacity used by the IoT device while the IoT device was operating in an active mode based on a temperature of an environment in which the IoT was located while the IoT device was operating in the active mode, determining an amount of battery capacity used by the IoT device while the IoT device was operating in a sleep mode based on a temperature of an environment in which the IoT was located while the IoT device was operating in the sleep mode, determining an amount of self-discharge of the non-rechargeable battery while the IoT was deployed based on a temperature of an environment in which the IoT device was located while the IoT was deployed, determining an estimated remaining battery life of the non-rechargeable battery based on an initial capacity of the non-rechargeable battery, the amount of battery capacity used by the IoT device while the IoT device was operating in the active mode, the amount of battery capacity used by the IoT device while the IoT device was operating in the sleep mode, and the amount of self-discharge of the non-rechargeable battery, and providing the estimated remaining battery life of the non-rechargeable battery to an administrator of the IoT device. An advantage of some embodiments is that they consume less power to estimate the remaining battery life of a battery compared to techniques that use a specific/discrete integrated processing component such as a fuel gauge. Also, an advantage of some embodiments is that they work well even with batteries that have flat voltage discharge curves since they do not rely on detecting changes in voltage (although voltage measurements (e.g., which can be obtained from an analog-to-digital converter) can still be used for other purposes, for example, to detect that a change of batteries occurred, to detect that end of life is near (depending on the battery chemistry), etc.). Embodiments descried herein may be particularly useful for IoT devices that operate in locations that have wide swings in temperature and/or that move around to locations having widely varying temperatures.

Embodiments will now be described with reference to the accompanying figures.

FIG. 1 is a diagram showing a system in which the remaining battery life of a non-rechargeable battery can be estimated, according to some example embodiments. As shown in the diagram, system includes an IoT device 110, a management server 140, and an electronic device 150. The electronic device 150 may be owned and/or operated by an administrator of the IoT device 110. The administrator may be an owner of the IoT device 110 or an operator of the IoT device 110. In some embodiments, the IoT device 110 is part of an IoT network that is managed through the management server 140.

The IoT device 110 is an electronic device that is operative to be coupled with the management server 140. The IoT device 110 may be mounted on a mobile asset (e.g., a vehicle, a truck, a trailer, etc.) or a stationary asset (e.g., a voting booth, a wall, a water meter, etc.). In some embodiments, the asset is an unpowered asset (e.g., a trailer, portable toilet, a water meter, a voting booth, etc.). In other embodiments, the asset is a powered asset (connected to a power source) but the IoT device 110 may not have permanent or constant access to the power source of the powered asset. In some embodiments, the IoT device 110 is not plugged in to the power source of the asset, while in other embodiments the IoT device 110 has an intermittent connection to the power source of the asset. The asset is typically located remotely from the management server 140 and may change location over a period of time or remain stationary at the same location.

The IoT device 110 is operative to be coupled with the management server 140 through a Wide Area Network (WAN) 130 (e.g., the Internet). The connection to the WAN 130 may be a wireless connection (e.g., a cellular connection). In some embodiments, the IoT device 110 is subject to intermittent connectivity with the WAN 130. The IoT device 110 may be implemented as described with reference to FIG. 8.

In some embodiments, the IoT device 110 is a wireless sensing device (WSD). A WSD is an electronic device that includes one or more sensors for detecting/measuring physical events/properties (e.g., temperature, humidity, barometric pressure, $CO_2$ concentration, acceleration, pressure, sound, movement, etc.) and recording sensor measurements in response to the detection/measurement of these physical events/properties. The WSD may record the sensor measurements related to detected/measured physical events/properties over a period of time. The WSD may record sensor measurements at regular intervals of time (e.g., the WSD may record the temperature of a room or an object (e.g., refrigerator, food product, etc.) every N seconds or minutes), and transmit the recorded sensor measurements to the management server 140. The WSD may store the sensor measurements in a non-transitory computer-readable medium of the WSD. The WSD may be operative to be coupled to a gateway device and establish a communication channel to transfer the recorded sensor measurements. In some embodiments, the WSD connects to the gateway device through a wireless connection (e.g., Bluetooth Low Energy (BLE) connection, WiFi connection, etc.). Thus, the WSD may be operative to detect a gateway device and negotiate a connection to the gateway device. The WSD may transmit/receive data to/from the management server 140 via the gateway device. When compared to a gateway device, the WSD is generally a smaller and less complex device. For example, the WSD may not include a cellular communication interface, whereas a gateway device may include the cellular communication interface. In some embodiments, the gateway device connects to the management server 140 using a cellular connection (and/or WiFi connection) and the WSD connects to the gateway device through a short-range communication interface such as a BLE interface.

In some embodiments, the IoT device 110 functions as a gateway device and is operative to be coupled with other IoT devices, such as WSDs, to receive/transmit data from/to the WSDs and transmit/receive this data to/from the management server 140.

The IoT device 110 is operative to record or obtain data related to an asset on which it is mounted or the environment in which it is located. The IoT device 110 is operative to transmit the data to the management server 140 through the WAN 130. In an embodiment, the IoT device 110 is an asset tracker. In such an embodiment, the IoT device 110 may include a location sensor 115. The location sensor 115 is operative to determine the location of the IoT device 110. For example, the location sensor 107 may be a Global Positioning System (GPS) sensor that records GPS coordinates or other type of location information. In some embodiments, the location sensor 115 is located outside of the IoT device 110 and coupled with the IoT device 110 through a wireless protocol (e.g., a short-range wireless communication protocol). In some embodiments, the IoT device 110 includes or may be coupled with one or more other sensors not shown in the diagram. For purposes of illustration, embodiments are primary described herein in a context where the IoT device 110 is an asset tracker. However, it should be understood that the techniques for estimating remaining battery life described herein can be applied to other types of IT devices 110.

As shown in the diagram, the IoT device 110 includes a non-rechargeable battery 102 (also referred to herein simply as battery 102), a temperature sensor 120, and a duration tracker 125. The battery 102 is used to power the IoT device 110. The temperature sensor 105 is operative to measure the temperature of an environment in which the IoT device 110 is located. In some embodiments, the temperature sensor 120 is located outside of the IoT device 110 and coupled with the IoT device 110 through a wireless protocol (e.g., a short-range wireless communication protocol). The duration tracker 125 is operative to track the length of time that the IoT device 110 operates in certain modes and/or the length of time that the IoT device 110 performs certain tasks. For example, the duration tracker 125 may track the length of time that the IoT device 110 was operating in an active mode and/or the length of time that the IoT device 110 performed a GPS scan.

The IoT device 110 is operative to operate in an active mode and a sleep mode. The active mode may be a mode of operation where all or most of the components of the IoT device 110 are enabled. In contrast, the sleep mode may be a mode of operation where only a small subset of components of the IoT device 110 are enabled to reduce power consumption (and thus conserve battery).

When operating in the active mode, the IoT device 110 may perform various operations/tasks such as recording and/or obtaining sensor measurements and transmitting the recorded/obtained sensor measurements to the management server 140. For example, in an embodiment where the IoT device 110 is an asset tracker, the IoT device 110 may perform a location ping (using the location sensor 115) when the IoT device 110 is operating in the active mode. Performing a location ping may involve performing a GPS data download (e.g., an assisted GPS (AGPS) download to download orbital data about satellites or other data needed to perform a GPS scan), performing a GPS scan, and performing a GPS data upload (e.g., to transmit location information to the management server 140).

When operating in the sleep mode, the IoT device 110 does not perform some or all of the operations performed by the IoT device 110 while the IoT device 110 operates in the active mode. For example, in an embodiment where the IoT device 110 is an asset tracker, the IoT device 110 does not perform a location ping while operating in the sleep mode. In general, the IoT device 110 consumes less power when operating in the sleep mode compared to when the IoT device 110 operates in the active mode.

In operation, the IoT device 110 may transition between the sleep mode and the active mode. For example, in an embodiment where the IoT device is an asset tracker, the IoT device 110 may stay in the sleep mode most of the time (to conserve battery) but transition to the active mode twice a day to perform a location ping (e.g., to report the current location of the IoT device 110 to the management server 140). The IoT device 110 may transition back to the sleep mode once it finishes performing the location ping. The IoT device 110 may transition from the sleep mode to the active mode at predefined intervals of time (e.g., once a day, twice a day, once per hour, or every other day depending on the application and uses of the IoT device 110) and/or responsive to certain events (e.g., the detection of movement). When the IoT device 110 is mounted on an asset that needs to be located while the asset is moving, the IoT device 110 may be configured to transition from the sleep mode to the active mode more frequently (e.g., once an hour). However, when the IoT device 110 is mounted on an immobile asset, the IoT device 110 may configured to transition from the sleep mode to the active mode less frequently (e.g., once a day). Additionally or alternatively, the IoT device 110 may be configured to transition from the sleep mode to the active mode in response to internal and/or external events detected based on sensor measurements or timers. Various parameters and conditions can be used to trigger the transition between modes.

In some embodiments, the IoT device 110 is operative to generate temperature information and duration information that can be used to estimate the remaining battery life of the battery 102. The temperature information may include the temperature of the environment in which the IoT device 110 was located over time (e.g., every five minutes) while the IoT device 110 was deployed. This may include the temperature of the environment in which the IoT device 110 was located while the IoT device 110 was operating in the active mode and/or performing a particular task (e.g., a GPS data download, a GPS scan, or GPS data upload) while operating in the active mode, as well as the temperature of the environment in which the IoT device 110 was located over time while the IoT device 110 was operating in the sleep mode. The temperature information may be generated based on temperature measurements recorded by the temperature sensor 120. The duration information may include the length of time that the IoT device 110 was operating in the active mode and/or the length of time that the IoT device 110 performed a particular task while operating in the active mode ("duration-of-task information") (or other information that can be used to derive such lengths of time (e.g., timestamps of when the IoT device 110 started performing a particular task and when the IoT device 110 finished performing the particular task)). The duration information may be generated based on information tracked by the duration tracker 125. The IoT device 110 is operative to transmit the temperature information and duration information to the management server 140 through the WAN 130.

The management server 140 may be a cloud-based server operative to receive data from one or more electronic devices such as the IoT device 110. The data may include temperature information and duration information received from the IoT device 110. As shown in the diagram, the management server 140 includes a battery monitor 141 that is operative to estimate a remaining battery life of the battery 102 of the IoT device 110 based on the temperature information and duration information. The estimate of the remaining battery life may be expressed in terms of the amount of time left before the battery 102 fails, a percentage of battery capacity remaining, a number of wake ups (transitions from the sleep mode to the active mode) left to the IoT device 110 before the battery 102 fails, a time before which the battery 102 and/or the IoT device 110 needs to be replaced, or the like.

In some embodiments, the management server 140 updates the configuration of the IoT device based on the estimated remaining battery life. In some embodiments, the management server 140 is operative to transmit a notification and/or the estimated remaining battery life to an electronic device 150 of an administrator of the IoT device 110. The management server 140 may be implemented as described with reference to FIG. 9. While the management server 140 is shown in the diagram as being coupled with a single IoT device 110, those skilled in the art will understand that the management server 140 may be coupled with multiple IoT device and receive/transmit data from/to those IoT devices. The IoT devices may belong to a single administrative entity (e.g., organization, household, person, etc.) or belong to multiple administrative entities, which may be referred to as tenants.

Embodiments described herein estimate the remaining battery life of the battery 102 of the IoT device 110 based on the current draw of the IoT device 110. The current draw of the IoT device 110 may vary depending on which mode the IoT device 110 is operating in (as well as what task the IoT 110 device is performing when operating in that mode) and the temperature of the environment in which the IoT device 110 is located. Embodiments described herein take these factors into consideration to accurately estimate the remaining battery life of the battery 102 of the IoT device 110 (e.g., without relying on detecting changes in the voltage produced by the battery 102 and without using a fuel gauge).

Example operations for estimating the remaining battery life of a battery of an IoT device 110 are now described with reference to the drawing.

At operation 1, the IoT device 110 transmits temperature information and duration information to the management server 140. For example, the temperature information may include the temperature of the environment in which the IoT device 110 was located while the IoT device 110 was deployed and in the active mode. For example, if the IoT device 110 is an asset tracker, the temperature information may include the temperature of the environment in which the IoT device 110 was located while the IoT device 110 performed a GPS data download, a GPS scan, and/or a GPS data upload. The temperature information may also include the temperature of the environment in which the IoT device 110 was located over time (e.g., every five minutes) while the IoT device 110 was operating in the sleep mode. In some embodiments, in addition to the temperature information and the duration information, the IoT device 110 also transmits other information (e.g., location information generated based on location readings recorded by the location sensor 115) to the management server 140.

At operation 2, the battery monitor 141 determines the amount of battery capacity used by the IoT device 110 while the IoT device 110 was operating in the active mode based on the temperature information. For example, the battery monitor 141 may determine the amount of battery capacity used by the IoT device 110 to perform a location ping based on the temperature information. This may involve determining an amount of battery capacity used by the IoT device 110 to perform a GPS scan. The battery monitor 141 may determine the amount of battery capacity used by the IoT device 110 to perform the GPS scan based on determining the temperature of the environment in which the IoT device 110 was located while the IoT device 110 performed the GPS scan (e.g., which can be extracted from the temperature information provided by the IoT device 110), determining a current draw of the IoT device 110 while the IoT device 110 performed the GPS scan based on the temperature of the environment in which the IoT device 110 was located while the IoT device performed the GPS scan, and determining a length of time that the IoT device 110 performed the GPS scan (e.g., which can be extracted from the duration information provided by the IoT device 110). In some embodiments, the battery monitor 141 determines the current draw of the IoT device 110 based on accessing a mapping of temperature to current draw. For example, the battery monitor 141 may have access to a mapping that indicates that the IoT device 110 uses 30 milliamps (mA) to perform a GPS scan at 20 degrees Celsius, uses 35 mA to perform a GPS scan at 30 degrees Celsius, and so on. The mapping may be generated based on empirical data regarding the current draw of the IoT device 110 (or similar IoT devices) while performing a GPS scan at different temperatures in a controlled environment. The battery monitor 141 may access this mapping to determine the current draw corresponding to the temperature. In an embodiment, a mapping of temperature to power (e.g., in units of Watts) is used instead of a mapping of temperature to current draw (which could be advantageous because it does not assume that a specific voltage/battery configuration is being used). In some embodiments, the battery monitor 141 determines the current draw of the IoT device 110 based on performing an interpolation that is based on empirical data regarding the current draw of the IoT device 110 (or similar IoT devices) while performing a GPS scan at different temperatures. The battery monitor 141 may determine the amount of battery capacity used by the IoT device 110 to perform the GPS scan based on the current draw of the IoT device while the IoT device performed the GPS scan and the length of time that the IoT device performed the GPS scan (e.g., by multiplying the current draw by the length of time).

In some embodiments, determining the amount of battery capacity used by the IoT device 110 to perform the location ping also involves determining the amount of battery capacity used by the IoT device 110 to perform a GPS data download and/or a GPS data upload (however, these phases of the location ping tend to be shorter so they might not be as important as the GPS scan phase when determining the amount of battery capacity used to perform the location ping). In some embodiments, the amount of battery capacity used by the IoT device 110 to perform the GPS data download and/or GPS data upload is determined based on the estimated power level of a modem while the IoT device 110 performed the GPS data download and/or the GPS data upload and/or the temperature of the environment in which the IoT device 110 was located while the IoT device 110 performed the GPS data download and/or the GPS data upload. While an example is provided herein of determining the amount of battery capacity used by the IoT device 110 to perform a location ping, this is provided by way of example to help illustrate an embodiment. It should be understood that the same/similar techniques as described herein can be used to determine the amount of battery capacity used by an IoT device 110 to perform other types of tasks. For example, the techniques described herein can be used to determine the amount of battery capacity used by an IoT device 110 to perform the task of uploading data over LTE (Long Term Evolution) to a server. The battery capacity used for performing this task can vary depending on the signal strength and other environmental factors, as well as the amount of data uploaded. The modem of the IoT 110 may provide information about the signal strength and/or the other factors, and another mapping can be generated under controlled conditions, which can then be used in the field to allow the device to better estimate the battery capacity used by this task.

At operation 3, the battery monitor 141 determines the amount of battery capacity used by the IoT device 110 while the IoT device 110 was operating in the sleep mode based on the temperature information. For example, the battery monitor 141 may determine the temperature of the environment in which the IoT device 110 was located during each of one or more (non-overlapping) periods of time that occurred while the IoT device 110 was operating in the sleep mode (e.g., which can be extracted from the temperature information provided by the IoT device 110), determine the current draw of the IoT device 110 during each of the one or more periods of time based on the temperature of the environment in which the IoT device 110 was located during that period of time, and determine the amount of battery capacity used by the IoT device 110 during each of the one or more periods of time based on the current draw of the IoT device 110 during that period of time and the length of the period of time (e.g., by multiplying the current draw by the length of the period of time). The length of each period of time may be configurable. For example, if the temperature information includes temperatures measured in intervals of five minutes, then the length of each period of time may be five minutes (except the period of time when the IoT device 110 transitions out of the sleep mode, which may be shorter than five minutes), where each period of time corresponds to one of the temperatures. In some embodiments, the battery monitor 141 determines the current draw of the IoT device 110 based on accessing a mapping of temperature (or temperature bands) to current draw. For example, the battery monitor 141 may have access to a mapping that indicates that the IoT device 110 uses 30 microamps (µA) to operate in the sleep mode at 20 degrees Celsius, uses 35 µA to operate in the sleep mode at 30 degrees Celsius, and so on. As another example, the battery monitor 141 may have access to a mapping that indicates that the IoT device 110 uses a particular current draw to operate in the sleep mode when the temperature is between −20 degrees Celsius and −10 degrees Celsius, uses a particular current draw to operate in the sleep mode when the temperature is between −10 degrees Celsius and 0 degrees Celsius, uses a particular current draw to operate in the sleep mode when the temperature is between 0 degrees Celsius and 10 degrees Celsius, and so on. Different granularities of temperature bands may be used than described here. In some embodiments, the temperature bands get tighter at higher temperatures (e.g., because a change from 55 degrees Celsius to 60 degrees Celsius is more impactful compared to a change from 10 degrees Celsius to 15 degrees Celsius). The mapping may be generated based on empirical data regarding the current draw of the IoT device 110 (or similar IoT devices) while operating in the sleep mode at different temperatures in a controlled environment. The battery monitor 141 may access this mapping to determine the current draw corresponding to the temperature. In some embodiments, the battery monitor 141 determines the current draw of the IoT device 110 based on performing an interpolation that is based on empirical data regarding the current draw of the IoT device 110 (or similar IoT devices) while operating in the sleep mode at different temperatures. The battery monitor 141 may determine the total amount of battery capacity used by the IoT device 110 while the IoT device 110 was operating in the sleep mode based on accumulating the amount of battery capacity used by the IoT device 110 during each of the one or more periods of time that occurred while the IoT device 110 was operating in the sleep mode.

At operation 4, the management server 140 determines the amount of self-discharge of the battery 102 based on the temperature information. For example, the battery monitor 141 may determine the temperature of the environment in which the IoT device 110 was located during each of one or more periods of time that occurred while the IoT device 110 was deployed (e.g., which can be extracted from the temperature information provided by the IoT device 110), determine measured data provided by an energizer (e.g., a plot showing the typical self-discharge of the specific cell at different temperatures), and determine the amount of self-discharge of the battery 102 during each of the one or more periods of time based on the temperature of the environment in which the IoT device 110 was located during that period of time and the measured data provided by the energizer (e.g., in a similar manner to the way the amount of battery capacity used is determined). The battery monitor 141 may determine the amount of self-discharge of the battery 102 based on accumulating the amount of self-discharge of the battery 102 during each of the one or more periods of time that occurred while the IoT device 110 was deployed. Self-discharge is a phenomenon in batteries in which internal chemical reactions reduce the stored charge of the battery over time. Self-discharge of a battery 102 may be affected by temperature (e.g., self-discharge tends to happen more quickly at higher temperatures). Thus, taking the temperature into consideration may improve the accuracy when determining the amount of self-discharge.

At operation 5, the battery monitor 141 determines the estimated remaining battery life of the battery 102 based on the initial capacity of the battery 102 (e.g., which may be known/obtained based on the specifications of the battery 102), the amount of battery capacity used by the IoT device 110 while the IoT device 110 was operating in the active mode, the amount of battery capacity used by the IoT device 110 while the IoT device 110 was operating in the sleep mode, and the amount of self-discharge of the battery while the IoT device 110 was deployed. For example, the battery monitor 141 may determine the total amount of battery capacity used by the IoT device 110 over time based on the amount of battery capacity used by the IoT device 110 while the IoT device was operating in the active mode, the amount of battery capacity used by the IoT device 110 while the IoT device was operating in the sleep mode, and the amount of self-discharge of the battery 102 (e.g., by summing these amounts). The battery monitor 141 may then determine a remaining capacity of the battery 102 based on the initial capacity of the battery 102 and the total amount of battery capacity used by the IoT device 110 (e.g., by subtracting the total amount of battery capacity used by the IoT device 110 from the initial capacity of the battery 102). The battery monitor 141 may then determine a predicted current draw of the IoT device 110 and determine the estimated remaining battery life of the battery 102 based on the remaining capacity of the battery 102 and the predicted current draw of the IoT device 110 (e.g., by dividing the remaining capacity of the battery 102 by the predicted current draw of the IoT device 110). The predicted current draw of the IoT device 110 may be a prediction of the future current draw of the IoT device 110. The battery monitor 141 may determine the predicted current draw of the IoT device 110 based on the historical current draw of the IoT device 110 and/or a temperature forecast for the remaining life of the battery.

In an embodiment, at operation 6, the management server 140 updates the configuration of the IoT device 110 based on the estimated remaining battery life of the battery 102. For example, if the estimated remaining battery life indicates that the battery will fail soon, then the management server 140 may update the configuration of the IoT device 110 such that the IoT device 110 consumes less power (e.g., by waking up less frequently) to conserve battery. Additionally or alternatively, at operation 7, the management server 140 transmits a notification to the electronic device 150 of the administrator of the IoT device 110 that includes the estimated remaining battery life of the battery 102. The notification may be an email, a text message, an automated phone call, and/or a notification on an application used by the administrator to manage the IoT device 110. At operation 8, the administrator of the IoT device 110 may take appropriate action in view of the estimated remaining battery life of the battery (e.g., replace the battery or the IoT device 110 before the battery fails).

While embodiments are described herein where some operations are performed by the IoT device 110 and other operations are performed by the management server 140, in some embodiments, the performance of the operations can be distributed among the IoT device 110 and the management server 140 in a different manner. For example, the IoT device 110 may perform operations 2-5 to determine the estimated remaining battery life of the battery 102 and transmit the estimated remaining battery life to the management server 140 (in which case operation 1 may be unnecessary). As another example, the IoT device 110 may perform operations 1 and 2 and the management server 140 may perform operations 3-5. Of course, other distributions of responsibilities are possible. Embodiments are described in further detail herein with reference to the flow diagrams of FIGS. 2-6.

The operations in the flow diagrams herein will be described with reference to the exemplary embodiments of the other figures. However, it should be understood that the operations of the flow diagrams can be performed by embodiments of the invention other than those discussed with reference to the other figures, and the embodiments of the invention discussed with reference to these other figures can perform operations different than those discussed with reference to the flow diagrams.

Also, while the flow diagrams in the figures show a particular order of operations performed by certain embodiments, it should be understood that such order is provided as an example only (e.g., alternative embodiments may perform the operations in a different order, combine certain operations, overlap certain operations, etc.).

Figure 2:
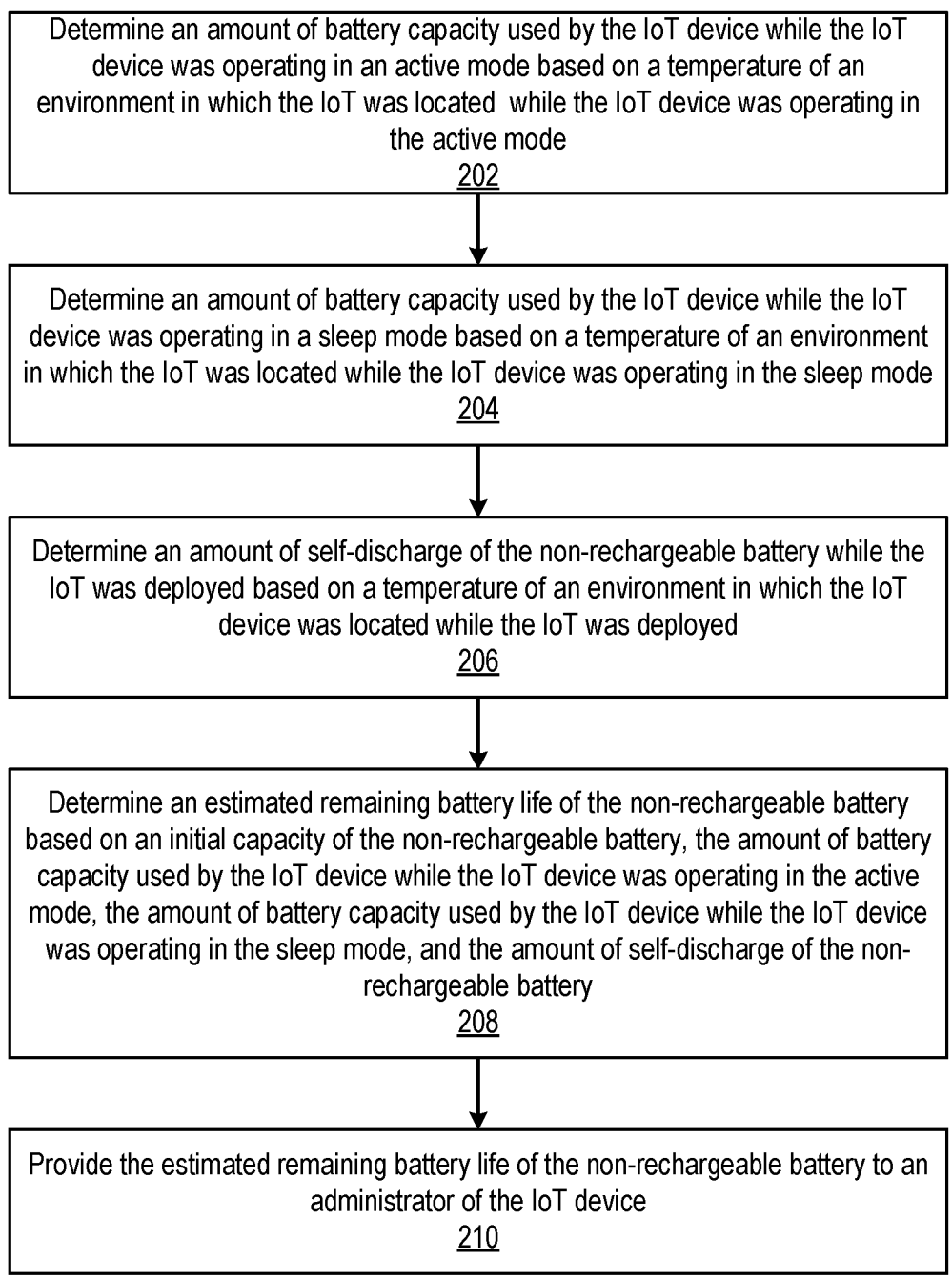
FIG. 2 is a flow diagram showing operations for estimating the remaining battery life of a battery of an IoT device, accordance to some embodiments.

FIG. 2 is a flow diagram showing operations for estimating the remaining battery life of a battery of an IoT device, accordance to some embodiments. For sake of example only, the operations of the flow diagram are described as being performed by a management server 140. However, in some embodiments, some of the operations are performed by the management server 140 while others are performed by the IoT device 110. As another alternative, the operations may be performed by the IoT device 110.

At operation 202, the management server determines an amount of battery capacity used by the IoT device while the IoT device was operating in an active mode based on a temperature of an environment in which the IoT was located while the IoT device was operating in the active mode. This operation may involve the operations shown in FIG. 3.

At operation 204, the management server determines an amount of battery capacity used by the IoT device while the IoT device was operating in a sleep mode based on a temperature of an environment in which the IoT was located while the IoT device was operating in the sleep mode. This operation may involve the operations shown in FIG. 4.

At operation 206, the management server determines an amount of self-discharge of the non-rechargeable battery while the IoT was deployed based on a temperature of an environment in which the IoT device was located while the IoT was deployed. This operation may involve the operations shown in FIG. 5.

At operation 208, the management server determines an estimated remaining battery life of the non-rechargeable battery based on an initial capacity of the non-rechargeable battery, the amount of battery capacity used by the IoT device while the IoT device was operating in the active mode, the amount of battery capacity used by the IoT device while the IoT device was operating in the sleep mode, and the amount of self-discharge of the non-rechargeable battery. This operation may involve the operations shown in FIG. 6.

At operation 210, the management server provides the estimated remaining battery life of the non-rechargeable battery to an administrator of the IoT device (e.g., in a notification transmitted to the electronic device of the administrator).

In some embodiments, the management server updates the configuration of the IoT device if the management server determines that the estimated remaining battery life is below a threshold. For example, the management server may update the configuration of the IoT device such that the IoT device wakes up (e.g., transition from the sleep mode to the active mode) less frequently to reduce power consumption. For example, instead of waking up twice a day, the IoT device may be configured to wake up every other day until the battery is replaced. As another example, the management server may update the configuration of the IoT device such that the IoT device stops performing certain operations while it is in the active mode (e.g., record less sensor measurements).

In some embodiments, the management server determines the estimated remaining battery life of the non-rechargeable battery based on the initial capacity of the non-rechargeable battery and one or more of (but not necessarily all of): the amount of battery capacity used by the IoT device while the IoT device was operating in the active mode, the amount of battery capacity used by the IoT device while the IoT device was operating in the sleep mode, and the amount of self-discharge of the non-rechargeable battery (e.g., the amount of self-discharged may not be used if it is deemed to be insignificant for purposes of estimating remaining battery life).

FIG. 3 is a flow diagram showing operations for determining an amount of battery capacity used by the IoT device while the IoT device was operating in an active mode, according to some embodiments. The operations may be performed as part of performing operation 202 of FIG. 2.

At operation 304, the management server determines an amount of battery capacity used by the IoT device to perform a location ping (e.g., when the IoT device is an asset tracker). This operation may involve performing operations 306-316.

At operation 306, the management server determines an amount of battery capacity used by the IoT device to perform a GPS data download based on a temperature of an environment in which the IoT was located while the IoT device performed the GPS data download.

At operation 308, the management server determines a temperature of an environment in which the IoT device was located while the IoT device performed a GPS scan.

At operation 310, the management server determines a current draw of the IoT device while the IoT device performed the GPS scan based on the temperature of the environment in which the IoT device was located while the IoT device performed the GPS scan (e.g., based on accessing a mapping of temperature (or temperature bands) to current draw or performing an interpolation, as described herein above).

At operation 312, the management server determines a length of time that the IoT device performed the GPS scan.

At operation 314, the management server determines an amount of battery capacity used by the IoT device to perform the GPS scan based on the current draw of the IoT device while the IoT device performed the GPS scan and the length of time that the IoT device performed the GPS scan (e.g., by multiplying the current draw by the length of time).

At operation 316, the management server determines an amount of battery capacity used by the IoT device to perform a GPS data upload based on a temperature of an environment in which the IoT was located while the IoT device performed the GPS data upload.

The total amount of battery capacity used by the IoT device to perform the location ping may be the sum of the amount of battery capacity used to perform the GPS data download, the amount of battery capacity used by the IoT device to perform the GPS scan, and the amount of battery capacity used by the IoT device to perform the GPS data upload.

FIG. 4 is a flow diagram showing operations for determining an amount of battery capacity used by the IoT device while the IoT device was operating in a sleep mode, according to some embodiments. The operations may be performed as part of performing operation 204 of FIG. 2.

The management server may perform operations 404-408 for each of one or more (non-overlapping) periods of time (e.g., five minute time periods) that occurred while the IoT device was operating in the sleep mode.

At operation 404, the management server determines a temperature of an environment in which the IoT device was located during the period of time.

At operation 406, the management server determines a current draw of the IoT device during the period of time based on the temperature of the environment in which the IoT device was located during the period of time (e.g., based on accessing a mapping of temperature (or temperature bands) to current draw or performing an interpolation, as described herein above).

At operation 408, the management server determines an amount of battery capacity used by the IoT device during the period of time based on the current draw of the IoT device during the period of time and a length of the period of time (e.g., by multiplying the current draw by the length of time).

At operation 410, the management server accumulates (e.g., sums) the amount of battery capacity used by the IoT device during each of the one or more periods of time to determine the amount of battery capacity used by the IoT device while the IoT device was operating in the sleep mode.

FIG. 5 is a flow diagram showing operations for determining an amount of self-discharge of the non-rechargeable battery while the IoT was deployed, according to some embodiments. The operations may be performed as part of performing operation 206 of FIG. 2.

The management server may perform operations 504-408 for each of one or more periods of time (e.g., five minute time periods) that occurred while the IoT device was deployed.

At operation 504, the management server determines a temperature of an environment in which the IoT device was located during the period of time.

At operation 506, the management server determines measured data provided by an energizer.

At operation 508, the management server determines an amount of self-discharge of the non-rechargeable battery during the period of time based on the temperature of the environment in which the IoT device was located during the period of time, a length of the period of time, and the measured data provided by an energizer.

At operation 510, the management server accumulates (e.g., sums) the amount of self-discharge of the non-rechargeable battery during each of the one or more periods of time to determine the amount of self-discharge of the battery while the IoT device was deployed.

FIG. 6 is a flow diagram showing operations for determining an estimated remaining battery life of the non-rechargeable battery, according to some embodiments. The operations may be performed as part of performing operation 208 of FIG. 2.

At operation 604, the management server determines a total amount of battery capacity used by the IoT device based on the amount of battery capacity used by the IoT device while the IoT device was operating in the active mode, the amount of battery capacity used by the IoT device while the IoT device was operating in the sleep mode, and the amount of self-discharge of the non-rechargeable battery (e.g., by summing the amount of battery capacity used by the IoT device while the IoT device was operating in the active mode, the amount of battery capacity used by the IoT device while the IoT device was operating in the sleep mode, and the amount of self-discharge of the non-rechargeable battery).

At operation 606, the management server determines a remaining capacity of the non-rechargeable battery based on the initial capacity of the non-rechargeable battery and the total amount of battery capacity used by the IoT device (e.g., by subtracting the total amount of battery capacity used by the IoT device from the initial capacity of the non-rechargeable battery).

At operation 608, the management server determines a predicted current draw of the IoT device.

At operation 610, the management server determines the estimated remaining battery life of the non-rechargeable battery based on the remaining capacity of the non-rechargeable battery and the predicted current draw of the IoT device (e.g., by dividing the remaining capacity of the non-rechargeable battery by the predicted current draw of the IoT device).

Figure 7:
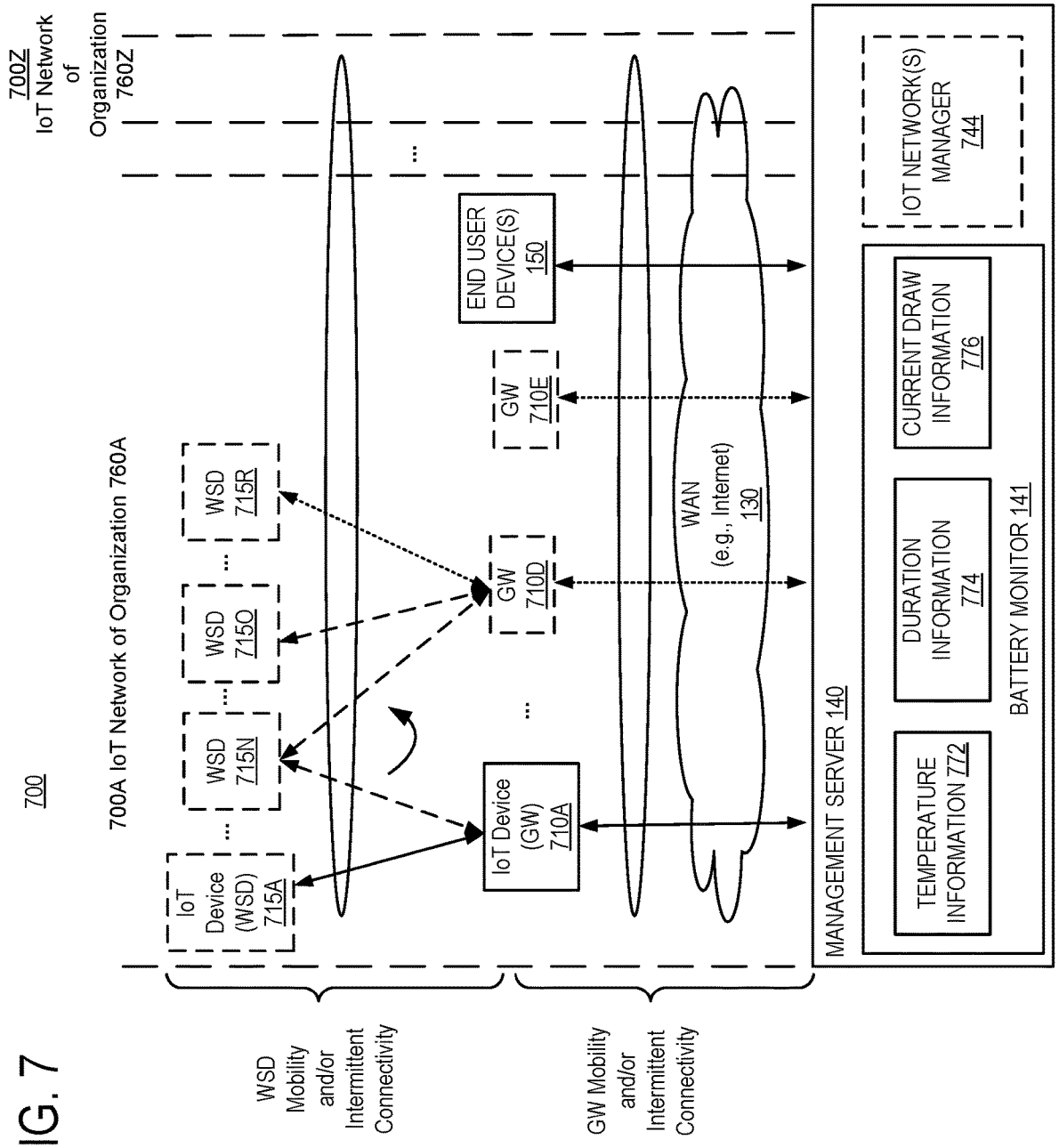
FIG. 7 is a block diagram showing IoT networks 700, according to some embodiments.

FIG. 7 is a block diagram showing IoT networks 700, according to some embodiments. The management server 140 provides an IoT networks service to one or more organizations. As shown in the diagram, the management server 140 may be coupled, through the WAN 130, to a plurality of gateway devices 710 and wireless sensing devices 715 forming multiple IoT networks (e.g., 700A-700Z) belonging to respective organizations (e.g., 710A-710Z). Each organization possesses a set of gateway devices 710 and wireless sensing devices 715 for monitoring physical events (e.g., monitoring the temperature of refrigerated goods being transported, monitoring fleets of vehicles by recording location, movement and/or acceleration information, monitoring humidity and/or temperature at various locations within a room or a building, etc.).

IoT Network 700A of organization 760A is an exemplary deployment of an IoT network including a plurality of IoT devices, which may include WSDs 715 and gateway devices 710. The IoT network 700A includes a plurality of WSDs 715 coupled with one or more gateway devices 710. For example, WSDs 715A to 715N are coupled to gateway device (GW) 710A, WSDs 715O to 715R are coupled with gateway device 710D, etc. While four WSDs 715 and three gateway devices 710 are shown in the diagram, the IoT network 700A may include more or less WSDs 715 and gateway devices 710. Each one of the gateway devices 710 may be mobile or stationary. For example, the gateway device 710D may be a mobile gateway device located within a vehicle transporting goods, which also includes one or more mobile WSDs 715 that can connect to the gateway device 710D. The IoT network service enables the offload of data, which includes the offload of temperature information and duration information (operations 740 and 730) from the WSDs 715 to the management server 140 through a first communication channel between the gateway devices 710 and the WSDs 715 and through a second communication channel between the management server 140 and the gateway devices 710 of the IoT network 700A. In some embodiments, a gateway device (e.g., gateway device 710E) may not be coupled to any WSD 715, and the data transmitted to the management server 140 is data recorded by the gateway device 710E.

In some embodiments, the IoT network service enables the WSDs 715 to offload data to one of the gateway devices 710 of the same organization as soon as one of the gateway devices 710 is within range of the WSD 715 and a connection is established, while deleting data only when a confirmation is received from the gateway devices 710. In addition, the gateway devices 710 are operative to store the data from the WSDs 715 and offload the data to the management server 140 when a connection is established without deletion of the data prior to the receipt of an acknowledgement message from the management server 140. This ensures that all data transmitted from the WSDs 715 is received at the management server 140 even in scenarios of mobility of the devices or intermittent connectivity. The management server 140 may reconcile the data received from each WSD 715 through one or more gateway devices 710 (which may occur potentially following multiple connection interruptions or mobility of the WSD 715) to present to a user of the organization an uninterrupted representation of the sensor measurements of each WSD 715.

The IoT network service may be a multi-tenant service and may process and manage data from various IoT networks belonging to different organizations (e.g., organization 760A and organization 760Z) while ensuring that data recorded by a WSD 715 of a first organization (e.g., 760A) is not transmitted to a user of the second organization (e.g., 760Z).

The management server 140 may include an IoT network manager 744 that is operative to manage the deployment and configuration of the IoT networks 700A-Z.

In some embodiments, the management server 140 stores temperature information 772, duration information 774, and current draw information 776. The temperature information 772 may include temperatures of the environments in which an IoT device was located. The duration information 774 may include information regarding the lengths of time a IoT device performed a particular task (e.g., a GPS scan) or operated in a certain mode (e.g., active mode). The current draw information 776 may include information that allows for determining a current draw of an IoT device based on the temperature of the environment in which the IoT device operated (e.g., a mapping of temperature (or temperature bands) to current draw). The battery monitor 141 may estimate the remaining battery life of a battery of an IoT device based on the temperature information 772, the duration information 774, and/or the current draw information 776, as described herein above. The estimate can be used for a variety of purposes, including providing sufficiently early notice (e.g., to an administrator) of low battery life to allow the battery or the entire IoT device to be replaced before the battery completely fails.

Exemplary Electronic Devices

One or more parts of the above embodiments may include software and/or a combination of software and hardware. An electronic device (also referred to as a computing device, computer, etc.) includes hardware and software, such as a set of one or more processors coupled to one or more machine-readable storage media (e.g., magnetic disks, optical disks, read only memory (ROM), flash memory, phase change memory, solid state drives (SSDs)) to store code (which is composed of software instructions and which is sometimes referred to as computer program code or a computer program) for execution on the set of processors and/or to store data. For instance, an electronic device may include non-volatile memory (with slower read/write times, e.g., magnetic disks, optical disks, read only memory (ROM), Flash memory, phase change memory, SSDs) and volatile memory (e.g., dynamic random access memory (DRAM), static random access memory (SRAM)), where the non-volatile memory persists code/data even when the electronic device is turned off, or when power is otherwise removed, and the electronic device copies that part of the code that is to be executed by the set of processors of that electronic device from the non-volatile memory into the volatile memory of that electronic device during operation because volatile memory typically has faster read/write times. As another example, an electronic device may include a non-volatile memory (e.g., phase change memory) that persists code/data when the electronic device is turned off, and that has sufficiently fast read/write times such that, rather than copying the part of the code/data to be executed into volatile memory, the code/data may be provided directly to the set of processors (e.g., loaded into a cache of the set of processors); in other words, this non-volatile memory operates as both long-term storage and main memory, and thus the electronic device may have no or only a small amount of volatile memory for main memory. In addition to storing code and/or data on machine-readable storage media, typical electronic devices can transmit code and/or data over one or more machine-readable transmission media (also called a carrier) (e.g., electrical, optical, radio, acoustical or other form of propagated signals—such as carrier waves, infrared signals). For instance, typical electronic devices also include a set of one or more physical network interface(s) to establish network connections (to transmit and/or receive code and/or data using propagating signals) with other electronic devices. Thus, an electronic device may store and transmit (internally and/or with other electronic devices over a network) code and/or data with one or more machine-readable media (also referred to as computer-readable media).

Electronic devices are used for a variety of purposes. For example, an electronic device (sometimes referred to as a server electronic device) may execute code that cause it to operate as one or more servers used to provide a service to other electronic device(s) (sometimes referred to as a client electronic device, a client computing device, or a client device) that executes client software (sometimes referred to as client code or an end-user client) to communicate with the service. The server and client electronic devices may be operated by users respectively in the roles of administrator (also known as an administrative user) and end-user.

Alternative embodiments of an electronic device may have numerous variations from that described above. For example, customized hardware and/or accelerators might also be used in an electronic device.

Figure 8:
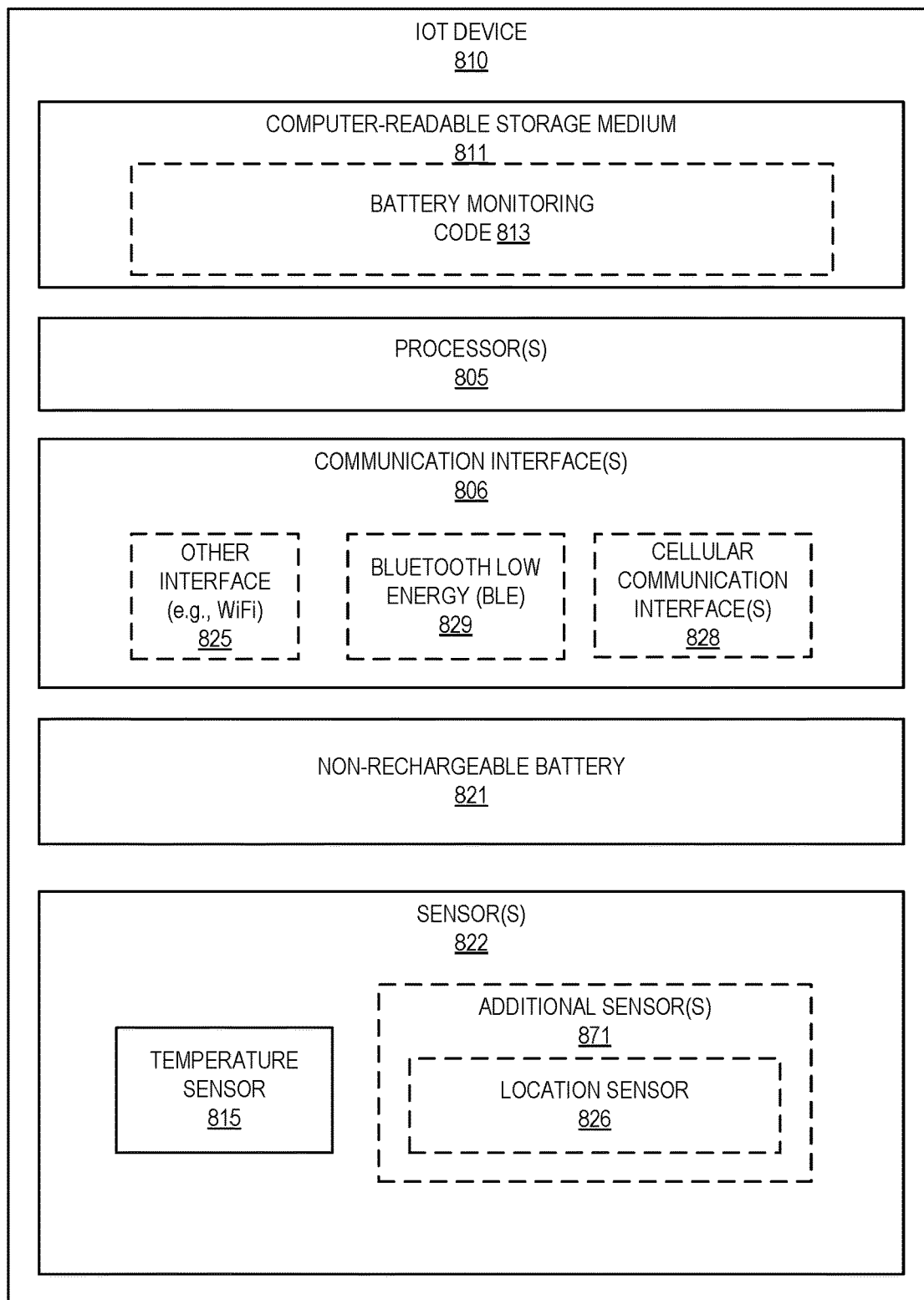
FIG. 8 is a diagram showing an IoT device, according to some embodiments.

FIG. 8 is a diagram showing an IoT device, according to some embodiments. As shown in the diagram, the IoT device 810 includes one or more processors 805 and a computer-readable storage medium 811 (e.g., a non-transitory machine-readable medium), which is coupled to the processor(s) 805. The computer-readable storage medium 811 may be used for storing data, metadata, and programs for execution by the processor(s) 805. For example, the depicted computer-readable storage medium 811 may store battery monitoring code 813 that, when executed by the processor(s) 805, causes the IoT device 810 to record and transmit temperature information and/or duration information to the management server 140 to allow the management server 140 to estimate the remaining battery life of a non-rechargeable battery 821 of the IoT device 810 according to embodiments described herein. In some embodiments, the batter monitoring code 813, when executed by the processor(s) 805, causes the IoT device 810 to perform one or more of the operations described with respect to FIGS. 1-6. The non-rechargeable battery 821 (e.g., a lithium thionyl chloride battery), also known as primary battery or primary cells, may be designed to be used once and discarded. In general, the electrochemical reaction occurring in the non-rechargeable battery is not reversible, rendering the cell unrechargeable. As the non-rechargeable battery 821 is used, the chemicals in the battery are used up to generate power; when the chemicals are gone, the battery 821 stops producing electricity. The non-rechargeable battery 821 powers the IoT device 810.

The IoT device 810 also includes one or more sensors used to record sensor measurements in response to physical events. For example, the IoT device 810 includes a temperature sensor 815. The temperature sensor 815 is coupled with the non-rechargeable battery 821 and is operative to measure the temperature of the surrounding environment. While the temperature sensor 815 is illustrated as being separate from the processor(s) 805, this should be seen as a logical representation presented for illustrative purposes only. In some embodiments, the temperature sensor 815 is built in a microcontroller (MCU) processing unit that is part of a printed circuit board in the IoT device 810. In other embodiments, the temperature sensor 815 is implemented as a separate component from the processor(s) 805. In some embodiments, the IoT device 810 includes one or more additional sensors 871 (e.g., location sensor 826). In some embodiments, one or more of the additional sensors 871 can be integrated into the IoT device 810. In other embodiments, one or more of the additional sensors 871 can be separate from the IoT device 810. When an additional sensor is separate from the IoT device 810, it can connect to the IoT device 810 through a wireless communication interface (e.g., a short-range communication interface such as BT or BLE, or the like) or alternatively it can connect via a wired communication interface (e.g., a general-purpose input/output (GPIO)).

The IoT device 810 also includes one or more communication interfaces 806, which are provided to allow a user to provide input to, receive output from, and otherwise transfer data to and from the IoT device 810. Exemplary Input/Output devices and interfaces include wired and wireless transceivers, such as Joint Test Action Group (JTAG) transceiver, a Bluetooth Low Energy (BLE) transceiver 829 an IEEE 802.11 transceiver, an infrared transceiver, a wireless cellular communication interface (e.g., 2G, 3G, 4G, 5G, etc.) 828, a diagnostic port, or another wireless protocol 825 to connect the IoT device 810 with another device, external component, or a network, and receive stored instructions, data, tokens, etc. It will be appreciated that one or more buses may be used to interconnect the various components shown in FIG. 8.

It will be appreciated that additional components, not shown, may also be part of the IoT device 810, and, in certain embodiments, fewer components than that shown in FIG. 8, may also be used in an IoT device 810. In some embodiments, the IoT device 810 acts as a gateway device or alternatively as a WSD.

Figure 9:
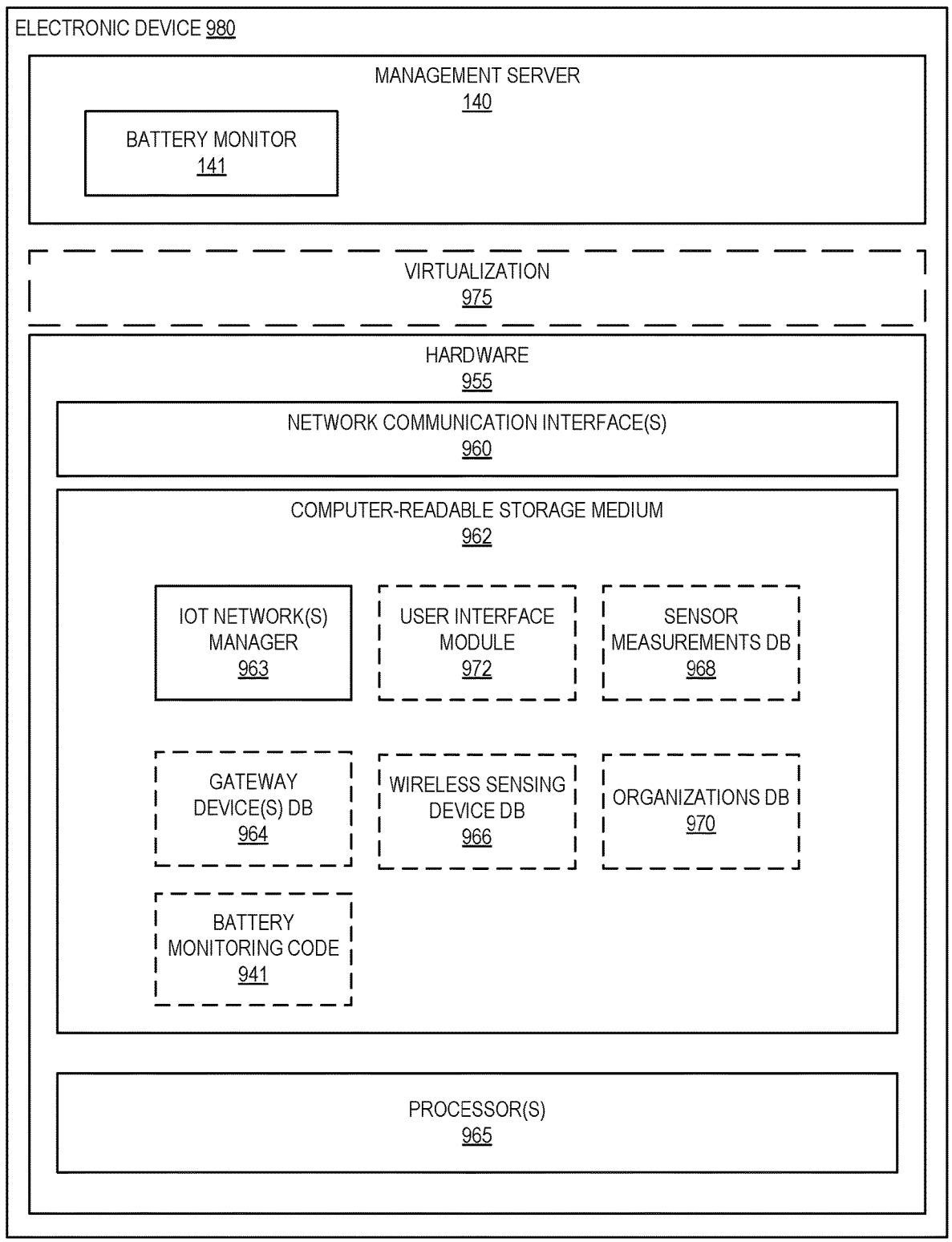
FIG. 9 is a diagram showing a management server that can be used in some embodiments.

FIG. 9 is a diagram showing a management server that can be used in some embodiments. Management server 140 may be a web or cloud server, or a cluster of servers, running on server hardware. In one embodiment, the management server 140 works for both single and multi-tenant installations, meaning that multiple organizations with different administrators may have IoT devices (e.g., wireless sensing devices and/or gateway devices) managed by the same management server.

According to one embodiment, management server 140 is implemented on an electronic device 980 which includes hardware 955. Hardware 955 includes network communication interfaces 960 coupled with one or more processor(s) 965, and a computer-readable storage medium 962. The computer-readable storage medium 962 (e.g., a non-transitory machine-readable medium) includes an IoT network manager 963 used to configure and manage the IoT device(s) (e.g., IoT device 110) which may include gateway devices and/or WSDs for each organization. For example, the IoT network manager 963 may be operative to receive and manage information related to the IoT devices that belong to an organization. The IoT network manager 963 may be operative to receive information used to populate the gateway device database 964, the wireless sensing device database 966, and the organization database 970 with appropriate information when the WSDs and gateway devices are associated with an organization.

In an embodiment, the computer-readable storage medium 962 further includes a user interface module 972, which when executed on the processor(s) 965 causes the display of a Web interface on a client device. The Web interface allows administrators and/or users to create and log into an account associated with an organization to which a set of IoT devices belong (e.g., IoT device 110). The user interface module 972 can be used for managing and configuring the IoT devices. The computer-readable storage medium 962 further includes the sensor measurement database 978 (including data indicative of sensor measurements received from the IoT devices (e.g., temperature measurements)), optional gateway devices database 964 (including information regarding the gateway devices when the IoT devices include gateway devices), an optional wireless sensing device database 966 (including information regarding the WSDs when the IoT devices include WSDs), and an optional organizations database 970 (including information regarding the organizations to which the IoT devices belong). The computer-readable storage medium 962 may further include battery monitoring code 941 (which when executed by the processors 965 causes the management server 140 to perform the operations of a battery monitor 141, as described herein (e.g., to estimate the remaining battery life of a non-rechargeable battery of an IoT device).

While one embodiment does not implement virtualization, alternative embodiments may use different forms of virtualization—represented by a virtualization layer 975. In these embodiments, the management server 140, and the hardware that executes it, form a virtual management server which is a software instance of the modules stored on the computer-readable storage medium 962. In electronic devices that use compute virtualization, the set of one or more processor(s) 965 typically execute software to instantiate the virtualization layer 975 and software container(s) (e.g., with operating system-level virtualization, the virtualization layer 975 represents the kernel of an operating system (or a shim executing on a base operating system) that allows for the creation of multiple software containers (representing separate user space instances and also called virtualization engines, virtual private servers, or jails) that may each be used to execute a set of one or more applications; with full virtualization, the virtualization layer 975 represents a hypervisor (sometimes referred to as a virtual machine monitor (VMM)) or a hypervisor executing on top of a host operating system, and the software containers, each represent a tightly isolated form of a software container called a virtual machine that is run by the hypervisor and may include a guest operating system; with para-virtualization, an operating system or application running with a virtual machine may be aware of the presence of virtualization for optimization purposes). Again, in electronic devices where compute virtualization is used, during operation an instance of the software is executed within the software container on the virtualization layer 975. In electronic devices where compute virtualization is not used, the instance on top of a host operating system is executed on the "bare metal" electronic device. The instantiation of the instance, as well as the virtualization layer and software containers, if implemented, are collectively referred to as software instance(s). The electronic device 980 can be used to perform the operations of a management server, as described herein.

While some components of the IoT device or the management server are illustrated as code stored on the computer-readable storage medium, in other embodiments the modules may be implemented in hardware or in a combination of hardware and software.

While the above description includes several exemplary embodiments, those skilled in the art will recognize that the invention is not limited to the embodiments described and can be practiced with modification and alteration within the spirit and scope of the appended claims. The description is thus illustrative instead of limiting.

What is claimed is:

1. A method for estimating a remaining battery life of a non-rechargeable battery of an Internet of Things (IoT) device, the method comprising:
    determining an amount of battery capacity used by the IoT device while the IoT device was operating in an active mode based on plurality of temperatures of environments in which the IoT device was located while the IoT device was operating in the active mode;
    determining an amount of battery capacity used by the IoT device while the IoT device was operating in a sleep mode based on plurality of temperatures of environments in which the IoT device was located while the IoT device was operating in the sleep mode;
    determining an estimated remaining battery life of the non-rechargeable battery based on an initial capacity of the non-rechargeable battery, the amount of battery capacity used by the IoT device while the IoT device was operating in the active mode, and the amount of battery capacity used by the IoT device while the IoT device was operating in the sleep mode; and
    responsive to determining that the estimated remaining battery life of the non-rechargeable battery is below a threshold, updating a configuration of the IoT device to transition to the active mode less frequently.

2. The method of claim 1, wherein determining an amount of battery capacity used by the IoT device while the IoT device was operating in the active mode comprises:
    determining an amount of battery capacity used by the IoT device to perform a location ping.

3. The method of claim 2, wherein determining the amount of battery capacity used by the IoT device to perform the location ping comprises:
    determining a temperature of an environment in which the IoT device was located while the IoT device performed a global positioning system (GPS) scan;
    determining a current draw of the IoT device while the IoT device performed the GPS scan based on the temperature the environment in which the IoT device was located while the IoT device performed the GPS scan;
    determining a length of time that the IoT device performed the GPS scan; and
    determining an amount of battery capacity used by the IoT device to perform the GPS scan based on the current draw of the IoT device while the IoT device performed the GPS scan and the length of time that the IoT device performed the GPS scan.

4. The method of claim 3, wherein determining the amount of battery capacity used by the IoT device to perform the location ping further comprises:
    determining an amount of battery capacity used by the IoT device to perform a GPS data download based on a temperature of an environment in which the IoT device was located while the IoT device performed the GPS data download; and
    determining an amount of battery capacity used by the IoT device to perform a GPS data upload based on a temperature of an environment in which the IoT device was located while the IoT device performed the GPS data upload.

5. The method of claim 1, wherein determining the amount of battery capacity used by the IoT device while the IoT device was operating in the sleep mode comprises:
receiving from the IoT device over a network temperature information that includes information regarding temperature measurements recorded over time by a temperature sensor of the IoT device;
determining, based on the received temperature information, a temperature of an environment in which the IoT device was located during each of a plurality of time periods that occurred while the IoT device was operating in the sleep mode;
determining a current draw of the IoT device during each of the plurality of time periods based on the temperature of the environment in which the IoT device was located during the time period;
determining an amount of battery capacity used by the IoT device during each of the plurality of time periods based on the current draw of the IoT device during the time period and a length of the time period; and
accumulating the amount of battery capacity used by the IoT device during each of the plurality of time periods.

6. The method of claim 5, wherein the current draw of the IoT device during a time period of the plurality of time periods is determined based on accessing a mapping of temperature bands to current draws.

7. The method of claim 5, wherein the current draw of the IoT device during a time period of the plurality of time periods is determined based on performing an interpolation that is based on empirical data of current draws at different temperatures.

8. The method of claim 1, further comprising:
determining an amount of self-discharge of the non-rechargeable battery while the IoT device was deployed based on a temperature of an environment in which the IoT device was located while the IoT device was deployed.

9. The method of claim 8, wherein determining the amount of self-discharge of the non-rechargeable battery comprises:
determining a temperature of an environment in which the IoT device was located during a time period that occurred while the IoT device was deployed;
obtaining measured data indicating a typical rate of self-discharge of battery cells at different temperatures; and
determining an amount of self-discharge of the non-rechargeable battery during the time period based on the temperature of the environment in which the IoT device was located during the time period, a length of the time period, and the measured data.

10. The method of claim 9, wherein determining the amount of self-discharge of the non-rechargeable battery further comprises:
determining an amount of self-discharge of the non-rechargeable battery during one or more other time periods that occurred while the IoT device was deployed; and
accumulating the amount of self-discharge of the non-rechargeable battery during the time period and the one or more other time periods.

11. The method of claim 8, wherein determining the estimated remaining battery life of the non-rechargeable battery comprises:
determining a total amount of battery capacity used by the IoT device based on the amount of battery capacity used by the IoT device while the IoT device was operating in the active mode, the amount of battery capacity used by the IoT device while the IoT device was operating in the sleep mode, and the amount of self-discharge of the non-rechargeable battery;
determining a remaining capacity of the non-rechargeable battery based on the initial capacity of the non-rechargeable battery and the total amount of battery capacity used by the IoT device; and
determining a predicted current draw of the IoT device, wherein the estimated remaining battery life of the non-rechargeable battery is determined based on the estimated remaining capacity of the non-rechargeable battery and the predicted current draw of the IoT device.

12. A non-transitory machine-readable storage medium that provides instructions that, if executed by one or more processors of a computer system will cause said computer system to perform operations for estimating a remaining battery life of a non-rechargeable battery of an Internet of Things (IoT) device, the operations comprising:
determining an amount of battery capacity used by the IoT device while the IoT device was operating in an active mode based on a plurality of temperatures of environments in which the IoT device was located while the IoT device was operating in the active mode;
determining an amount of battery capacity used by the IoT device while the IoT device was operating in a sleep mode based on a plurality of temperatures of environments in which the IoT device was located while the IoT device was operating in the sleep mode;
determining an estimated remaining battery life of the non-rechargeable battery based on an initial capacity of the non-rechargeable battery, the amount of battery capacity used by the IoT device while the IoT device was operating in the active mode, and the amount of battery capacity used by the IoT device while the IoT device was operating in the sleep mode; and
responsive to determining that the estimated remaining battery life of the non-rechargeable battery is below a threshold, updating a configuration of the IoT device to transition to the active mode less frequently.

13. The non-transitory machine-readable storage medium of claim 12, wherein determining an amount of battery capacity used by the IoT device while the IoT device was operating in the active mode comprises:
determining an amount of battery capacity used by the IoT device to perform a location ping.

14. The non-transitory machine-readable storage medium of claim 13, wherein determining the amount of battery capacity used by the IoT device to perform the location ping comprises:
determining a temperature of an environment in which the IoT device was located while the IoT device performed a global positioning system (GPS) scan;
determining a current draw of the IoT device while the IoT device performed the GPS scan based on the temperature the environment in which the IoT device was located while the IoT device performed the GPS scan;
determining a length of time that the IoT device performed the GPS scan; and
determining an amount of battery capacity used by the IoT device to perform the GPS scan based on the current draw of the IoT device while the IoT device performed the GPS scan and the length of time that the IoT device performed the GPS scan.

15. The non-transitory machine-readable storage medium of claim 12, wherein determining the amount of battery capacity used by the IoT device while the IoT device was operating in the sleep mode comprises:
receiving from the IoT device over a network temperature information that includes information regarding temperature measurements recorded over time by a temperature sensor of the IoT device;
determining, based on the received temperature information, a temperature of an environment in which the IoT device was located during each of a plurality of time periods that occurred while the IoT device was operating in the sleep mode;
determining a current draw of the IoT device during each of a plurality of time periods based on the temperature of the environment in which the IoT device was located during the time period;
determining an amount of battery capacity used by the IoT device during each of a plurality of time periods based on the current draw of the IoT device during the time period and a length of the time period; and
accumulating the amount of battery capacity used by the IoT device during each of the plurality of time periods.

16. The non-transitory machine-readable storage medium of claim 15, wherein the current draw of the IoT device during a time period of the plurality of time periods is determined based on accessing a mapping of temperature bands to current draws.

17. A computer system for estimating a remaining battery life of a non-rechargeable battery of an Internet of Things (IoT) device, the computer system comprising:
one or more processors; and
a non-transitory machine-readable storage medium that provides instructions that, if executed by the one or more processors, causes the computer system to perform operations comprising:
determining an amount of battery capacity used by the IoT device while the IoT device was operating in an active mode based on a plurality of temperatures of environments in which the IoT device was located while the IoT device was operating in the active mode,
determining an amount of battery capacity used by the IoT device while the IoT device was operating in a sleep mode based on a plurality of temperatures of environments in which the IoT device was located while the IoT device was operating in the sleep mode,
determining an estimated remaining battery life of the non-rechargeable battery based on an initial capacity of the non-rechargeable battery, the amount of battery capacity used by the IoT device while the IoT device was operating in the active mode, and the amount of battery capacity used by the IoT device while the IoT device was operating in the sleep mode, and
responsive to determining that the estimated remaining battery life of the non-rechargeable battery is below a threshold, updating a configuration of the IoT device to transition to the active mode less frequently.

18. The computer system of claim 17, wherein determining an amount of battery capacity used by the IoT device while the IoT device was operating in the active mode comprises:
determining an amount of battery capacity used by the IoT device to perform a location ping.

19. The computer system of claim 18, wherein determining the amount of battery capacity used by the IoT device to perform the location ping comprises:
determining a temperature of an environment in which the IoT device was located while the IoT device performed a global positioning system (GPS) scan,
determining a current draw of the IoT device while the IoT device performed the GPS scan based on the temperature the environment in which the IoT device was located while the IoT device performed the GPS scan,
determining a length of time that the IoT device performed the GPS scan, and
determining an amount of battery capacity used by the IoT device to perform the GPS scan based on the current draw of the IoT device while the IoT device performed the GPS scan and the length of time that the IoT device performed the GPS scan.

20. The computer system of claim 17, wherein determining the amount of battery capacity used by the IoT device while the IoT device was operating in the sleep mode comprises:
receiving from the IoT device over a network temperature information that includes information regarding temperature measurements recorded over time by a temperature sensor of the IoT device;
determining, based on the received temperature information, a temperature of an environment in which the IoT device was located during each of a plurality of time periods that occurred while the IoT device was operating in the sleep mode,
determining a current draw of the IoT device during each of the plurality of time periods based on the temperature of the environment in which the IoT device was located during the time period,
determining an amount of battery capacity used by the IoT device during each of the plurality of time periods based on the current draw of the IoT device during the time period and a length of the time period; and
accumulating the amount of battery capacity used by the IoT device during each of the plurality of time periods.

* * * * *